US006048789A

United States Patent [19]

Vines et al.

[11] Patent Number: 6,048,789

[45] Date of Patent: Apr. 11, 2000

[54] IC INTERCONNECT FORMATION WITH CHEMICAL-MECHANICAL POLISHING AND SILICA ETCHING WITH SOLUTION OF NITRIC AND HYDROFLUORIC ACIDS

[75] Inventors: Landon B. Vines; Craig A. Bellows; Walter D. Parmantie, all of San Antonio, Tex.

[73] Assignee: VLSI Technology, Inc., San Jose, Calif.

[21] Appl. No.: 08/807,069

[22] Filed: Feb. 27, 1997

[51] Int. Cl.[7] .................. H01L 21/461

[52] U.S. Cl. .................. 438/633; 438/745; 438/906; 438/692

[58] Field of Search .................. 438/633, 906, 438/692, 693, 745

[56] References Cited

U.S. PATENT DOCUMENTS 5,244,534 9/1993 Yu et al. .
5,662,769 9/1997 Schonauer et al. .

OTHER PUBLICATIONS

Burggraaf, Pieter, "Keeping the 'RCA' in Wet Chemistry Cleaning", *Semiconductor International*, Jun. 1994, pp. 86, 87, 88, 90.

Fury, Michael A., "Emerging developments in CMP for semiconductor planarization", *Solid State Technology*, Apr., 1995, pp. 47, 48, 50, 52.

Kern Jr., Frderick W., "Mechanism for Metallic Contamination of Semiconductor Wafer Surfaces", abstractd 304, pp. 498–499.

Oki, I, H. Shibayama, and A. Kagisawa, "Contamination Reduction in Dilute HF by Adding Hcl" Abstract No. 289, pp. 474–475.

*Primary Examiner*—Caridad Everhart
*Attorney, Agent, or Firm*—Clifton L. Anderson

[57] ABSTRACT

An integrated circuit manufacturing method uses chemical-mechanical polishing (CMP) to planarize a nonplanar sub-metal (or intermetal) silica dielectric layer. The planarized device is cleaned with an aqueous solution of ammonium hydroxide and citric acid. Exposed hydrated silica is etched using mixture of nitric and hydrofluoric acids, freeing embedded contaminants from the CMP slurry. The hydrofluroic acid is the etching agent, while the nitric acid combines with the freed contaminants to render water soluble products. They are thus carried away in an aqueous rinse, whereas otherwise they might recontaminate the device. A metal interconnect structure is formed on the etched oxide by forming contact apertures, depositing metal, and patterning the metal. The method can be applied also to nonplanar intermetal dielectrics and subsequent metal interconnect layers. The result is an integrated manufacturing method with higher yields and a more reliable manufactured integrated circuit.

1 Claim, 5 Drawing Sheets

IC INTERCONNECT FORMATION WITH CHEMICAL-MECHANICAL POLISHING AND SILICA ETCHING WITH SOLUTION OF NITRIC AND HYDROFLUORIC ACIDS

BACKGROUND OF THE INVENTION

The present invention relates to integrated circuit manufacturing and, more particularly, to integrated circuit interconnect formation. A major objective of the present invention is to provide for higher manufacturing yields and more reliable manufactured integrated circuit devices.

Progress in integrated circuit manufacture is generally associated with reductions in feature sizes; in fact, such progress can be roughly quantified as the minimum feature width definable by a given process technology. The features of interest are electrically active elements defined in a semiconductor substrate and conductive elements that provide access to and interconnection between the active elements. The minimum feature width for some of the earliest integrated circuits was a few microns; over the years, feature widths have dropped an order of magnitude. Reductions in feature width have allowed integrated circuit devices to be arranged closer together, providing greater functional density and higher operating speeds.

Although it has diminished along with feature width, feature thickness has not decreased as dramatically. Thus, relative to the feature width, deviations from planarity have become more severe. Such deviations from planarity pose a number of problems. For example, sharp focus is required to define small features photolithographically. Maximal sharpness occurs only at the focal plane of the photolithographic equipment, and focus becomes less sharp with distance from the focal plane. Where the nonplanarity is too severe, uniformly acceptable sharp focus cannot be achieved.

Planarization minimizes deviations from optimal sharpness, and thus is essential for defining minimal feature widths. Thus, a silica dielectric layer can be planarized so that a metal interconnect layer deposited thereon can be precisely patterned. (Silicas are a family of silicon-oxide materials including silicon dioxide and glasses, e.g., BPSG and SOG, commonly used as dielectrics in integrated circuits.) Chemical mechanical polishing (CMP), applicable to both conductors and dielectrics, has emerged as the planarized method of choice. While not fully understood, CMP of a silica layer is believed to involve continuous formation and abrasion of a hydrated silica sublayer, some of which remains in place once polishing has ended.

To the etchant and abrasives of the fresh slurry are added various polishing products from the integrated circuit, the polishing pad, and reaction products due to the action of the etchant. All of these spent slurry constituents are potential contaminants. A standard post-CMP clean uses a soft buffing pad with a solution including ammonium hydroxide and citric acid. This improves the surface finish and removes some particles. However, some metallic-ionic species typically remain to enter the hydrated silica sublayer and alter the electrical properties of the dielectric.

For large numbers of reliable integrated circuits to be manufactured, the structural and process materials involved must be precisely characterized. In general, this requires pure materials or pure materials that have been altered by the controlled introduction of impurities. While contamination is inevitable, even small amounts can impair the functioning, reliability, and/or lifetime of an integrated circuit. The susceptibility of integrated circuits to impairment by contamination has increased with decreasing feature sizes. In particular, the metallic contaminants resulting from CMP can impair the dielectric quality of the silica dielectric layers and increase their vulnerability to dielectric breakdown. Thus, to increase manufacturing yields and improve device reliability, it is necessary to address CMP-induced contamination more effectively.

SUMMARY OF THE INVENTION

The present method provides for integrated circuit metal interconnect formation. The assumed starting point for the method is a partially manufactured integrated circuit device with a nonplanar "top" surface of the device face on which interconnects are to be formed. The surface material can be dielectric or metal or have areas of both. In the main variations, the top surface is silica—e.g., silicon dioxide, borophosphate glass (BPSG), or spin-on glass (SOG).

The first step of the inventive method is to planarize the non-planar surface using CMP. Since CMP involves removal of material, the surface material after planarization need not be the same as the surface material before planarization—in other words, the polishing may expose a material originally covered by the nonplanar surface. For example, polishing a nonplanar metal surface can expose underlying silica, while polishing a nonplanar silica surface can expose underlying metal post vias or contacts. The invention requires that the planar surfaces resulting from CMP include at least some areas of silica. The planar surface may be entirely silica, or may include some areas of alternative material, such as metal. Preferably, a cleaning step with ammonium hydroxide and citric acid, followed by an aqueous rinse, is used to remove surface contaminants.

As a side-effect of the CMP planarization, the exposed silica is contaminated. Typically, CMP leaves a hydrated silica sublayer in which most of the contaminants are embedded. The invention requires etching of the exposed silica, preferably to a depth of 30 to 100 Ångstroms (Å). In the process, at least part of and preferably all of the hydrated sublayer is removed from the silica layer.

Etching is performed by treating the planarized device with a mixture of hydrofluoric and nitric acids. Preferably, the ratio by weight of $HNO_3$ to HF in the etchant is at least unity. The hydrofluoric acid is the active etching ingredient.

The inclusion of nitric acid in the silica etchant solution is surprising since silica resists etching by nitric acid. Furthermore, it is unusual to combine nitric and hydrofluoric acids in semiconductor manufacturing processes since their oxide vs. silicon selectivities are opposed. In the present context, however, the nitric acid reacts with many of the contaminants freed as the hydrated silica is etched. This impedes recontamination of the device. Furthermore, the nitride reaction products tend to be quite water soluble, so that they are readily removed in a subsequent rinse. The rinse water can then be removed in a drying step.

Optionally, a further silica deposition can take place. Since the underlying surface is planar, the resulting deposition is generally planar as well. For example, a silicon dioxide deposition can be made on a planarized SOG surface to protect subsequently deposited metal from contaminants that could migrate from the SOG.

Once a suitable planar surface is provided, metal interconnect formation can take place. Several substeps can be involved. The first substep is typically a patterning of the planarized dielectric layer to form apertures. If the planarized dielectric is a submetal dielectric, the apertures are contact apertures. If the planarized dielectric is an intermetal dielectric, the apertures are via apertures.

Metal is then deposited to fill the apertures and cover the dielectric. The metal in the apertures defines vias or contacts. The surface metal can be photolithographically patterned to define a layer of interconnects. The sequence dielectric deposition then CMP then etching then metal formation can be repeated until the desired number of interconnect levels is achieved. The last metal interconnect level can be passivated.

In one variation of the method, trenches are formed along with the apertures in the dielectric patterning substep. During the metal deposition substep, the interconnect pattern is formed by virtue of the filling of the trenches. Further photolithographic patterning is not necessary. However, the metal outside the trenches on the oxide surface can be removed using CMP, leaving a surface with both metal and silica areas. This patterned planar surface can be treated with the nitric and hydrofluoric acid mixture to remove contaminants in accordance with the invention. Intermetal or passivation silica is then deposited.

In some IC manufacturing methods, metal posts are built before the surrounding dielectric is deposited. If these posts are exposed by planarizing the dielectric, the metal interconnect formation step does not include a dielectric patterning substep. This approach permits the via and contact metals to differ from the interconnect metal. A planar metal layer is deposited and then photolithographically patterned.

The main advantage of the invention is reduced contamination of submetal and intermetal dielectrics. As a result, the electrical properties of the incorporating devices are more predictable. This predictability provides higher manufacturing yields and greater reliability in the manufactured devices. These and other features and advantages of the invention are apparent from the description below with reference to the following drawings.

DESCRIPTION OF THE PREFERRED EMBODIMENTS

Figure 1:
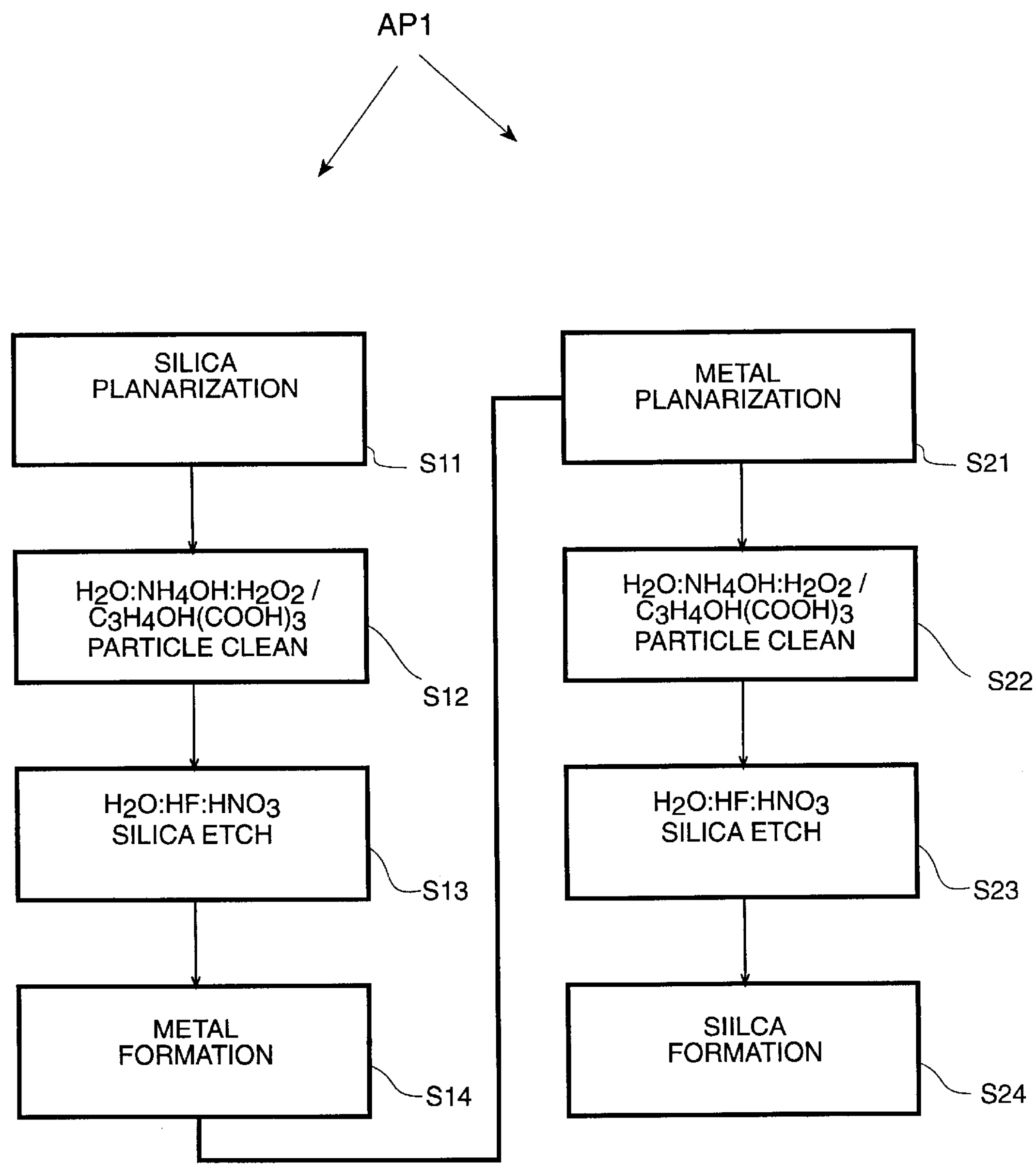
FIG. 1 is a flow chart of a method in accordance with the present invention.

In accordance with the present invention, a method AP1, as flow charted in FIG. 1, provides for an improved metal interconnect structure. Method AP1 begins with a partially manufactured integrated circuit device having a top nonplanar layer, for example, a BPSG submetal dielectric layer. Step S11 involves planarizing this layer using CMP to expose silica. Step S12 involves cleaning the planarized layer using an aqueous solution of ammonium hydroxide ($NH_4OH$) and citric acid ($C_3H_4OH(COOH)_3$). Step S13 involves etching the exposed silica with mixture of nitric ($HNO_3$) and hydrofluoric (HF) acids so that a thickness of 30 to 100 Å is removed. Step S14 involves forming a metal interconnect structure on the etched layer.

Metal formation step S14 can involve substeps of forming via apertures in the silica, depositing metal, and photolithographically patterning the metal. Alternatively, step S14 can involve the substeps of forming via apertures and trenches in the oxide, and depositing metal in the apertures and trenches, and on the oxide. This alternative is in accordance with the damascene method referred to "Emerging Developments in CMP for Semiconductor Planarization", by Michael A. Fury, *Solid State Technology,* April, 1995, pp. 47, 48, 50, and 52. In this alternative, method AP1 provides for a step S21 of planarizing the metal so as to expose silica, a step S22 of cleaning using ammonium hydroxide, a step S23 of etching exposed silica with a mixture of nitric and hydrofluoric acids, and a step S24 of forming a silica layer over the metal.

The metal interconnect layer can be a first metal layer or a subsequent metal layer. In the case of a first metal layer, the dielectric is a submetal dielectric, isolating the first metal layer from silicon and polysilicon structures below. In the case of subsequent metal layers, the dielectric is an intermetal dielectric, isolating the metal layer from a preceding metal layer. In either case, the dielectric is freer of contamination. As a result, manufacturing yields and device reliability are enhanced. Method AP1 is described in greater detail below in the context of the planarization of a submetal dielectric and definition of a first metal layer. Those skilled in the art can readily extrapolate to subsequent metal layers and intermetal dielectrics.

Figure 2:
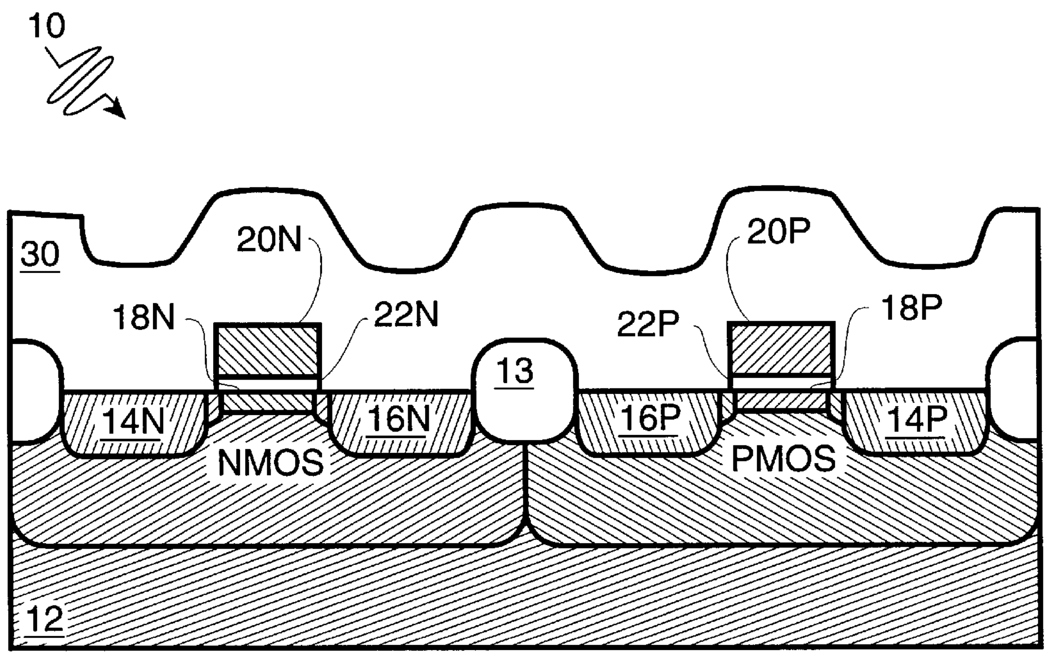
FIG. 2 is a schematic sectional view of an integrated circuit device in the process of manufacture prior to application of the method of FIG. 1.

An integrated circuit device 10 is shown in FIG. 2 at a stage in manufacturing at which method AP1 can be applied. Device 10 is a CMOS integrated circuit and includes an NMOS transistor and a PMOS transistor formed in and on a crystalline silicon substrate 12. The transistors are laterally isolated by field oxide regions 13. Active regions, e.g., sources 14N and 14P and drains 16N and 16P are formed in substrate 12; their electrical characteristics being determined by the presence of n-type and p-type dopants in the silicon. Electric current can flow between a source 14N, 14P, and a respective drain 16N, 16P, through a respective channel 18N, 18P. This current is controlled by the voltage differential between a respective gate 20N, 20P and the respective drain 16N, 16P. Each gate 20N and 20N is separated from the respective channel 18N, 18P, by a respective gate oxide 22N, 22P.

Over this structure, a submetal dielectric layer 30 is deposited. Typically, this deposition involves two or more substeps. The first substep can be a thin, e.g., about 1000 Å, TEOS silicon dioxide deposition. The second substep can be a TEOS borophosphate glass deposition the minimum thickness, e.g., about 1 $\mu$, of which is much greater than the thickness of gates 20N and 20P. Because field oxide formations 13 and gates 20N, 20P protrude above exposed silicon substrate features, e.g., sources 14N, 14P, drains 16N, 16P, submetal dielectric layer 30 is nonplanar. If not ameliorated, this nonplanarity could limit the effective resolution of the photolithography procedures used to define metal interconnect patterns.

In accordance with step S1, FIG. 1, dielectric layer 30 is planarized using a CMP procedure. As a byproduct of the CMP procedure, dielectric layer 30 includes a hydrated sublayer 32, shown in FIG. 3. Hydrated sublayer 32 is a locus for much of the CMP-slurry-related contamination. Surface contamination is reduced using the ammonium hydroxide and citric acid solution of step S12. Preferably, an aqueous rinse is used to remove the solution and the particles.

Figure 3:
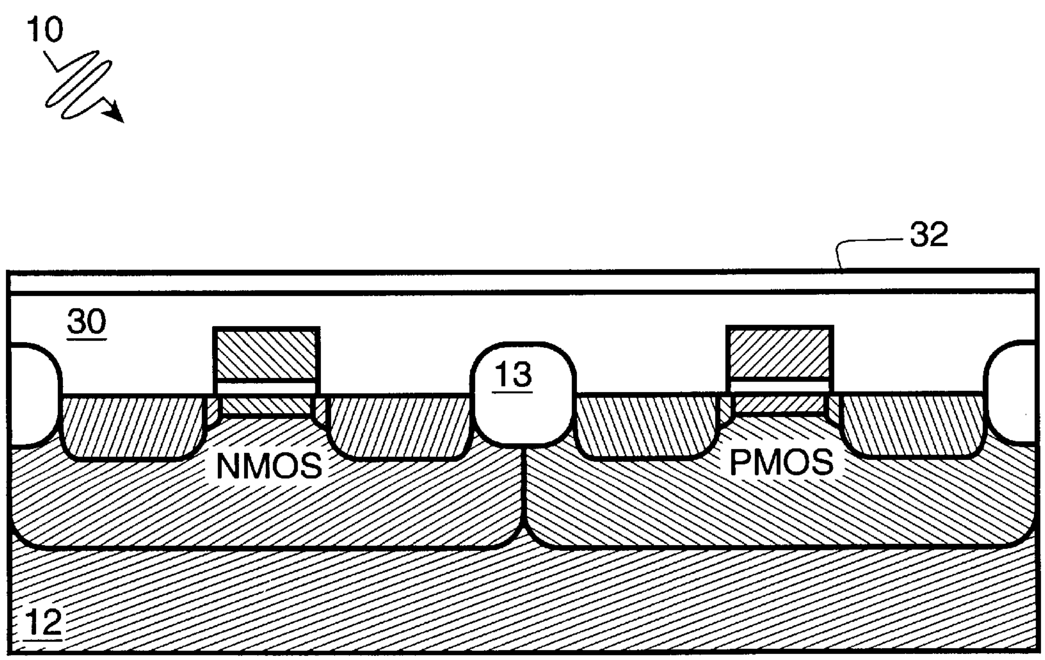
FIG. 3 is schematic sectional view of the device of FIG. 2 after a CMP oxide planarization step of the method of FIG. 1 is applied.

The structure of FIG. 3 is treated with a mixture of nitric and hydrofluoric acids in accordance with step S34. Preferably, the solution is 10:4:1 $H_2O$:$NHO_3$:HF by weight; a desirable alternative solution is 10:2:1. The solution can be applied for between five seconds and three minutes, depending on the susceptibility of the silica to the eteching. The proportion of hydrogen fluoride can be reduced by up to one half and increased by 100%. Even small amounts of nitric acid improve results relative to hydrofluoric acid alone. However, optimal results are achieved when the nitric acid concentration is at least as great as the hydrogen fluoride concentration.

Figure 4:
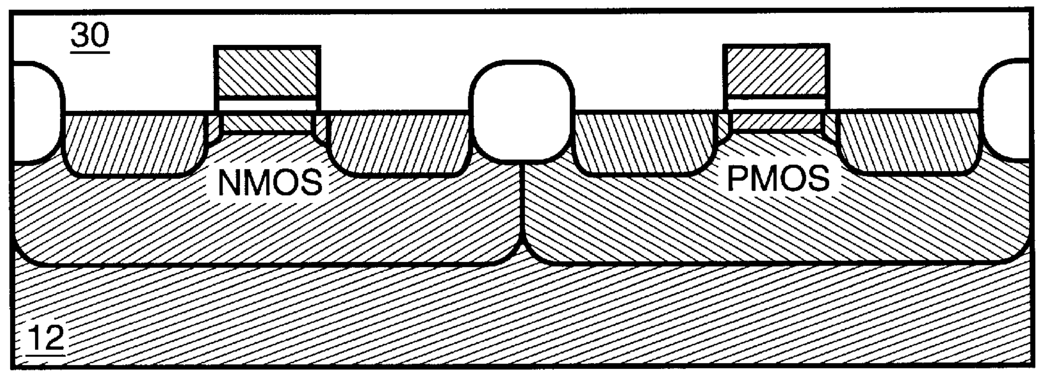
FIG. 4 is a schematic sectional view of the device of FIG. 3 after an etching step of the method of FIG. 1.

The hydrofluoric acid removes hydrated sublayer 32, yielding the structure of FIG. 4. The nitric acid combines with contaminants freed during etching to help prevent recontamination. The combination products are generally highly soluble in water so that they are readily removed in a subsequent rinse. The rinse water can be removed in a drying step in isopropyl alcohol (IPA) vapor.

Figure 5:
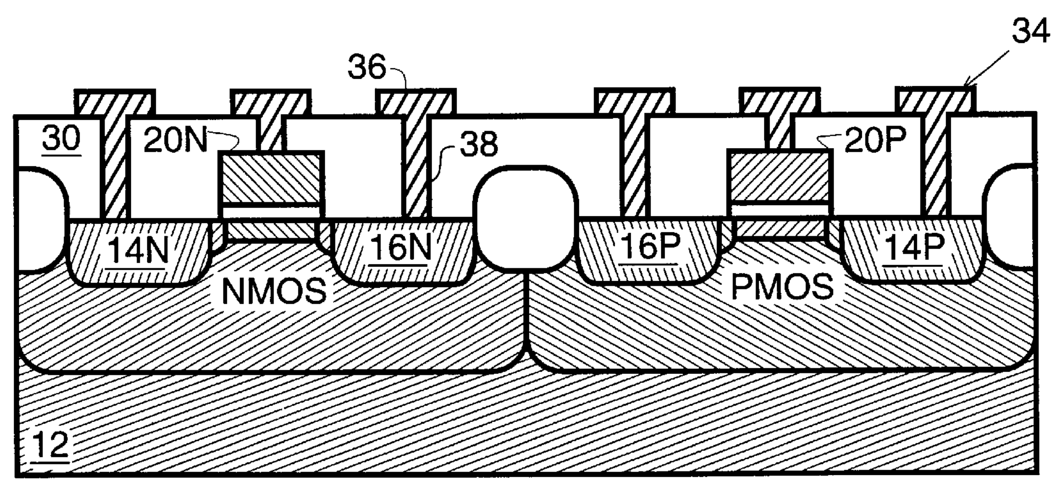
FIG. 5 is a schematic sectional view of the device of FIG. 4 after a metal formation step of a first variation of the method of FIG. 1.

Metal formation step 14 includes conventional substeps of forming contact apertures in dielectric layer 30, depositing metal, and photolithographically patterning the metal to yield a first metal interconnect layer 34, including interconnects 36 and contacts 38 to sources 14N, 14P, drains 16N, 16P, and gates 20N and 20P. The resulting structure is shown in FIG. 5.

Figure 6:
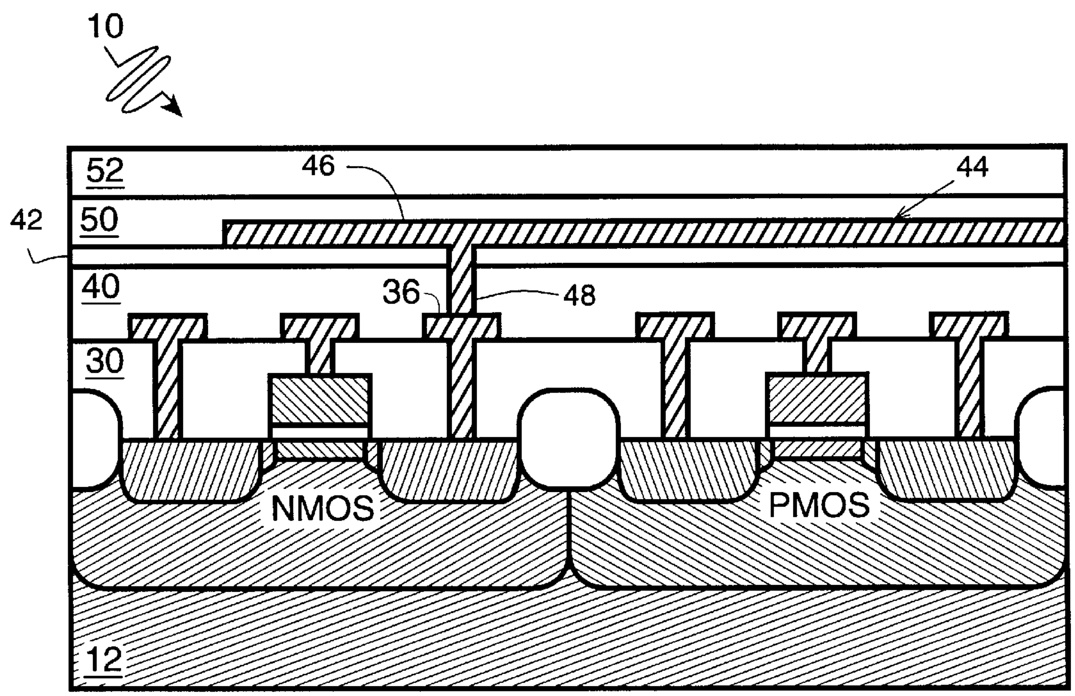
FIG. 6 is a schematic sectional view of the device of FIG. 5 after manufacturing involving further iterations of the method of FIG. 1 is completed.

Method AP1 can be reiterated in the formation of subsequent interconnect layers. A thin TEOS oxide deposition can be implemented on the structure of FIG. 5. A relatively thick spin-on glass is applied over the oxide. The pair 40 of dielectric layers, shown together in FIG. 6 after planarization, initially define a nonplanar surface due to the protrusion metal interconnects 36 above dielectric layer 30. Steps S11–S13 are applied to yield a relatively contamination-free planar dielectric surface.

A TEOS oxide deposition 42 protects subsequently deposited metal from contaminants in the spin-on glass. Step S14 follows by forming via apertures, depositing metal, and patterning metal to define a second metal interconnect layer 44, including interconnects 46 and vias 48. Optionally, this sequence can be repeated for additional intermetal dielectric layers and metal interconnect layers. Finally, silicon dioxide layer 50 and silicon nitride layer 52 are deposited to passivate device 10.

Figure 7:
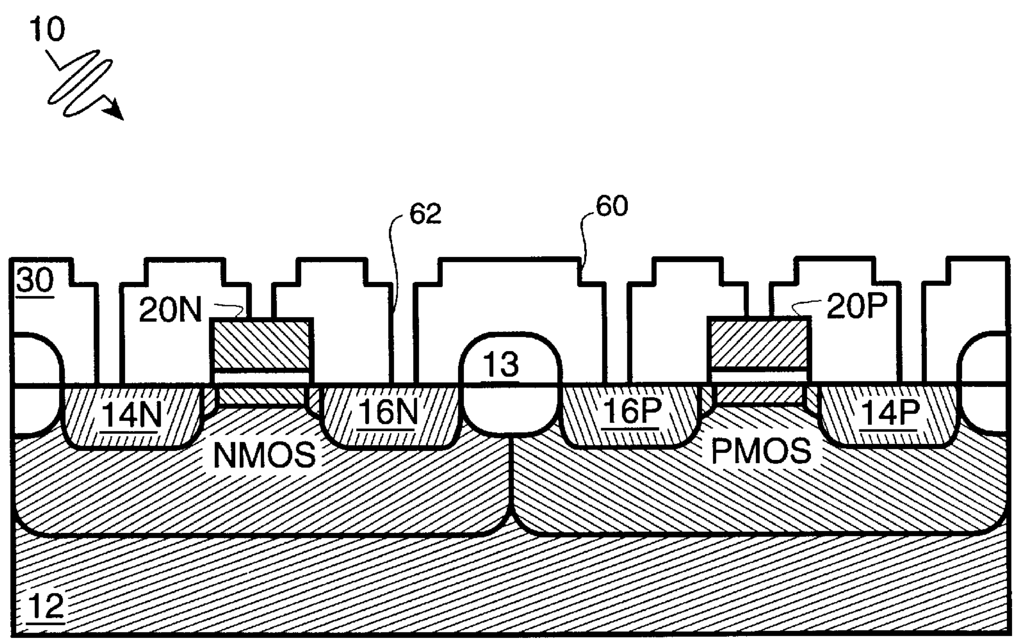
FIG. 7 is schematic sectional view of the device of FIG. 4 after a via and trench formation substep of a metal formation step of the method of FIG. 1.
Figure 8:
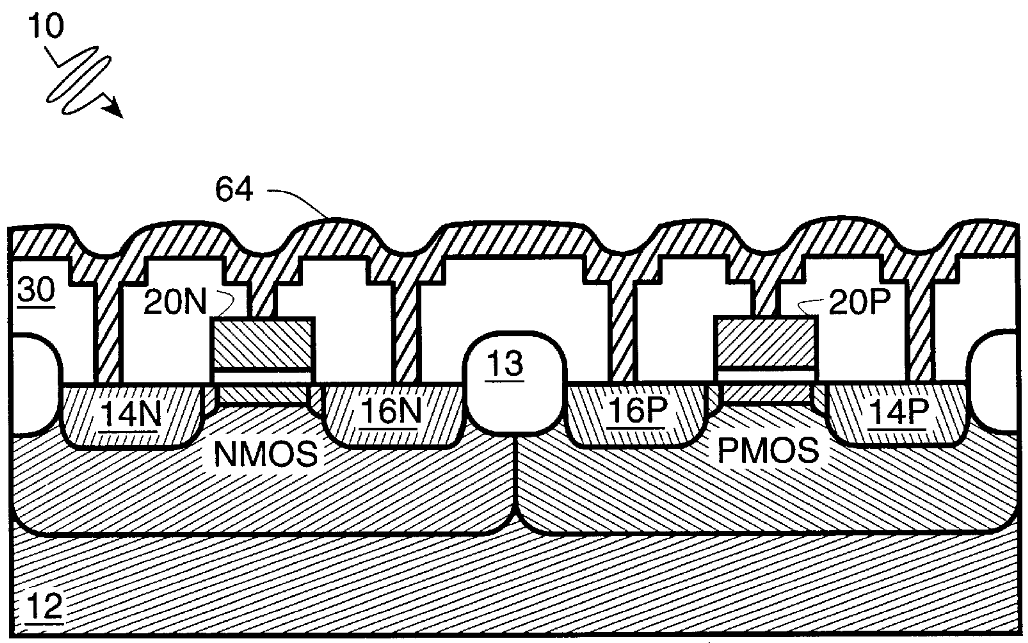
FIG. 8 is a schematic sectional view of the device of FIG. 7 after a metal deposition substep of the metal formation step of FIG. 7.

An important variation of method AP1 diverges from the main variation when steps S11–S13, leading to the structure of FIG. 4, are completed. The alternative step 14 begins with forming trenches 60 along with contact apertures 62 to sources 14N, 14P, drains 16N, 16P, and gates 20N and 20P, as shown in FIG. 7. Trenches 60 and contact apertures 62 can be photolithographically defined using a gradient mask to avoid inter-mask registration problems. Because of the recessing of trenches 60 relative to the top of dielectric layer 30, subsequently deposited metal layer 64 is nonplanar as shown in FIG. 8.

Figure 9:
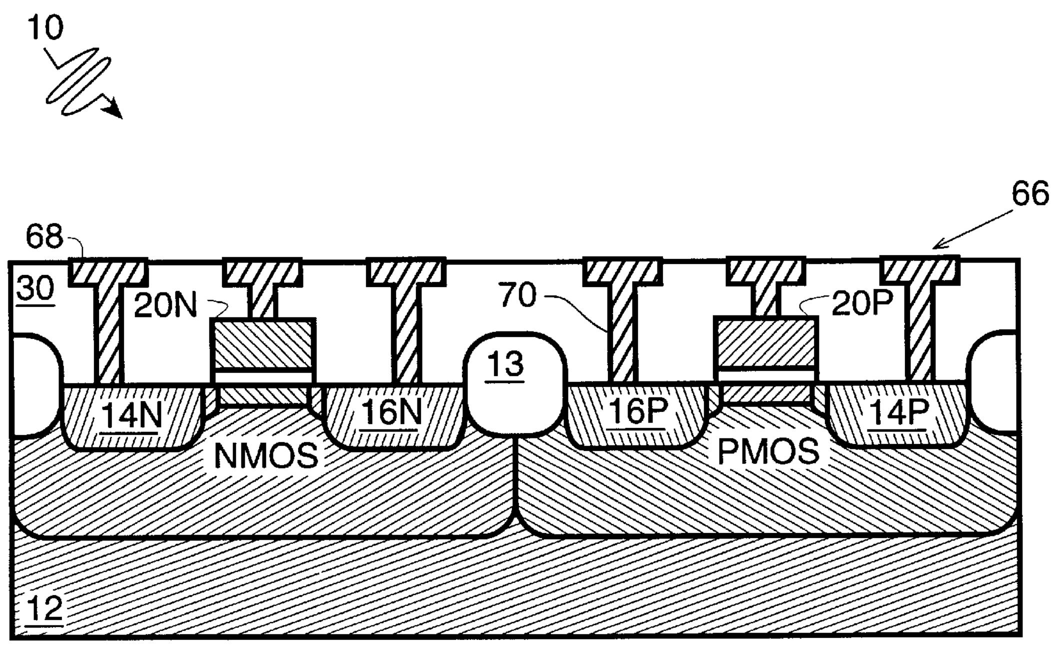
FIG. 9 is a schematic sectional view of the device of FIG. 8 after CMP metal planarization of the device of FIG. 8.

At this point, method AP1 continues with step 21 of planarizing metal layer 64 using CMP. In this case, polishing continues until all metal outside of trenches 60 and contact apertures 62 is removed, exposing submetal dielectric 30 and defining a first metal interconnect layer 66 having first metal interconnects 68 and contact vias 70, as shown in FIG. 9. Step 22 involves a clean with ammonium hydroxide and citric acid. Step 23 involves a nitric and hydrofluoric acid treatment. Step 24 involves formation of an intermetal dielectric (not shown).

Note that the structure of FIG. 9 is nearly planar. Submetal dielectric 30 is recessed 30–100 Å relative to first metal interconnects 68. Accordingly, planarization of an intermetal SOG layer is optional. If it is performed, it is performed in accordance with steps S11–S13 of method AP1. Either way, steps S14, S21–S24 are repeated for subsequent interconnect layers. Manufacturing is completed as in the main embodiment with formation of an oxide-nitride passivation layer.

In another variation of the invention, contacts or vias are built as pillars to be embedded in a subsequently deposited dielectric. The dielectric is planarized using CMP until the pillars are exposed. Metal is then deposited and patterned to form an interconnect layer. In this case, the metal formation step does not include a dielectric patterning substep.

While the invention has been described in the context of specific manufacturing sequences, other manufacturing contexts provide for considerable variations. The nonplanar surface at which the method begins can be oxide or other dielectric, metal, semiconductor, or other material. The surface exposed by planarization can be all or partially oxide, e.g., silicon dioxide, glass. The aqueous ammonium hydroxide solution preferably includes citric acid. However, chelating and other agents may be used in addition to or instead of the citric acid. The acid mixture may or may not include other components. The concentrations of the fluoride and acid can be varied, as can be treatment time and temperature. A metal formation step (typically including dielectric patterning) can take place immediately after oxide etching. Alternatively, an oxide or other deposition can precede metal formation.

What is claimed is:

1. In the manufacture of an integrated circuit, a method comprising the steps of:

a) planarizing a partially manufactured integrated-circuit device using chemical-mechanical polishing to yield a planar surface with at least some silica exposed;

b) etching said silica using a mixture of nitric and hydrofluoric acids;

c) forming a metal interconnect structure over said planar surface;

d) planarizing said metal interconnect structure so as to define a patterned surface with both metal and silica areas;

e) etching at least part way through said silica areas of said patterned surface using a solution including hydrogen fluoride and nitric acid; and f) depositing silicon dioxide on the structure resulting from step e.

* * * * *